United States Patent [19]

Gardopee et al.

[11] Patent Number: 5,610,102

[45] Date of Patent: Mar. 11, 1997

[54] METHOD FOR CO-REGISTERING SEMICONDUCTOR WAFERS UNDERGOING WORK IN ONE OR MORE BLIND PROCESS MODULES

[75] Inventors: George J. Gardopee, Southbury; Paul J. Clapis, Sandy Hook; Joseph P. Prusak, Danbury; Sherman K. Poultney, Ridgefield, all of Conn.

[73] Assignee: Integrated Process Equipment Corp., Phoenix, Ariz.

[21] Appl. No.: 152,780

[22] Filed: Nov. 15, 1993

[51] Int. Cl.$^6$ ................................................. H01L 21/302
[52] U.S. Cl. .......................... 437/225; 356/400; 356/401; 437/8; 148/DIG. 162
[58] Field of Search ..................................... 437/225, 228, 437/8; 356/400, 401; 148/DIG. 162

[56] References Cited

U.S. PATENT DOCUMENTS

| | | |
|---|---|---|
| 3,875,414 | 4/1975 | Prior et al. |
| 4,644,172 | 2/1987 | Sandland et al. |
| 4,720,635 | 1/1988 | Uga. |
| 4,752,898 | 6/1988 | Koenig. |
| 4,980,718 | 12/1990 | Salter et al. |

FOREIGN PATENT DOCUMENTS 0586195  3/1994  European Pat. Off..

Primary Examiner—George Fourson
Assistant Examiner—C. Everhart
Attorney, Agent, or Firm—Cahill, Sutton & Thomas P.L.C.

[57] ABSTRACT

A method for co-registering a semiconductor wafer (14) undergoing work in one or more blind process modules (10), (12) requires a means (16), (18) for consistently and repeatably registering the semiconductor wafer (14) to each process module (10), (12). Given this consistent and repeatable singular wafer registration means (16), (18), the location of the coordinate axes of each process module (10), (12) is determined with respect to the position of the semiconductor wafer (14) that is registered therein. The present invention method provides three approaches for determining the location of these axes: (1) an absolute location of the axes, (2) a relative location of the axes using one blind process module (10) to measure the position of a pattern etched into the semiconductor wafer (14) with another blind process module (12), and (3) a relative location of the axes using one blind process module (10) to measure surface or layer thickness characteristics in the semiconductor wafer (14) as modified by wafer processing. Regardless of which approach is followed, the determination of the location of the coordinate axes in each process module (10), (12) is an effective co-registration of the semiconductor wafer (14).

18 Claims, 2 Drawing Sheets

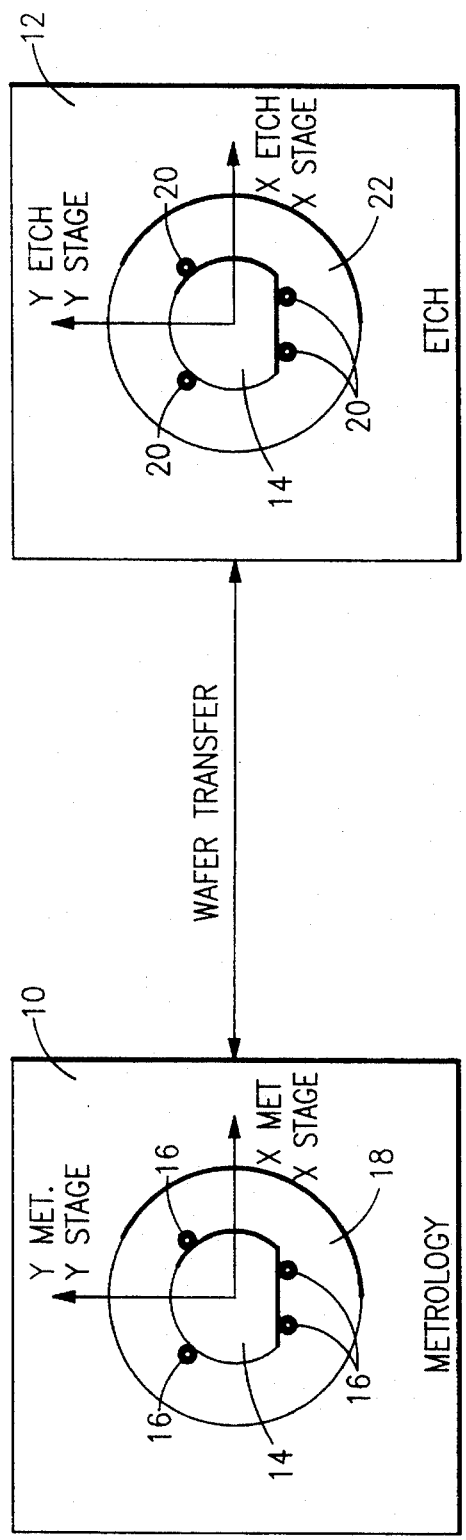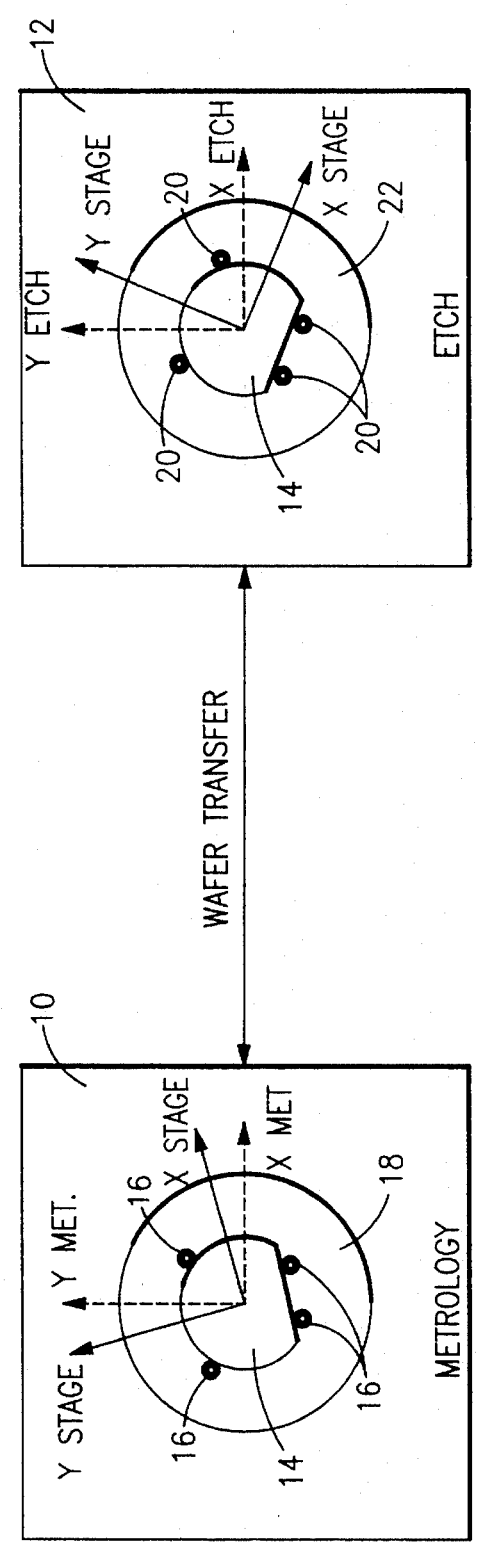

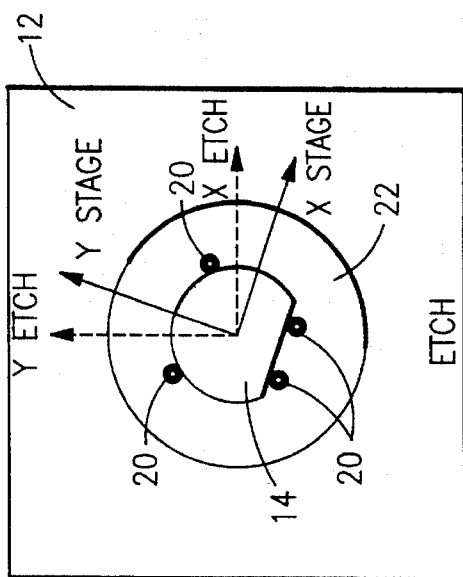
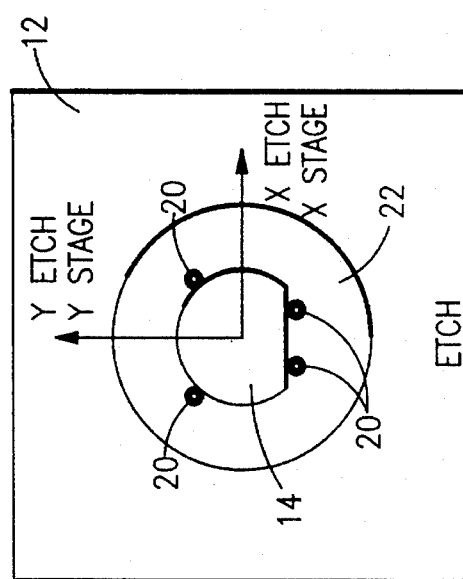
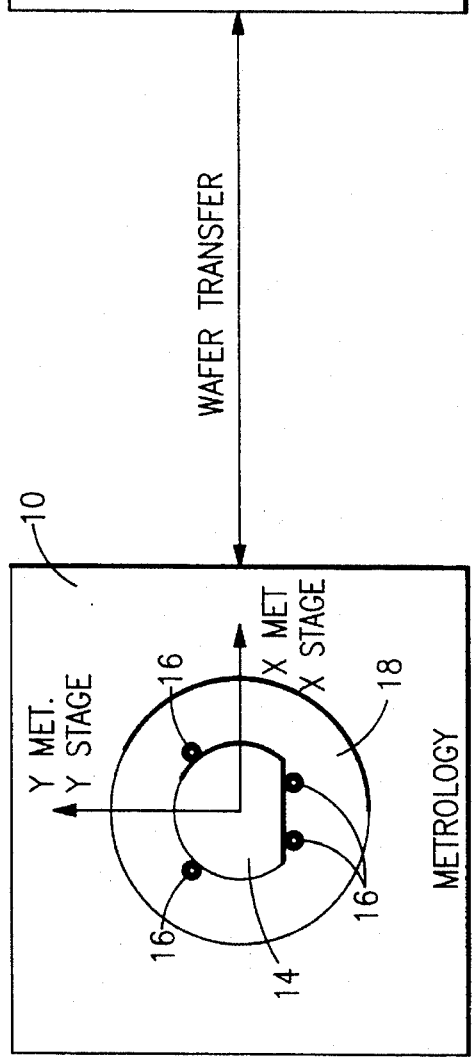
FIG.3
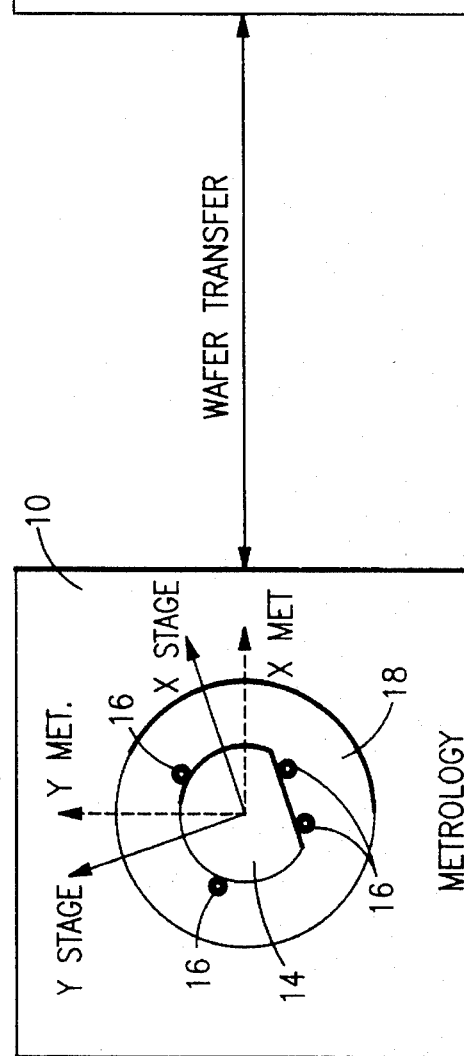
FIG.4

METHOD FOR CO-REGISTERING SEMICONDUCTOR WAFERS UNDERGOING WORK IN ONE OR MORE BLIND PROCESS MODULES

BACKGROUND OF THE INVENTION

The present invention generally relates to the registration of semiconductor wafers undergoing work in process modules and, in particular, relates to a method for co-registering semiconductor wafers undergoing work in one or more blind process modules.

A process for measuring the thickness of an outer material layer of a semiconductor wafer is known as a wafer metrology process. During such a wafer metrology process, a semiconductor wafer is mechanically registered to a stage in a wafer metrology instrument. The wafer metrology instrument generates a map that indicates the thickness of an outer material layer of the semiconductor wafer over an entire surface of the wafer. This outer material layer thickness map is used by another instrument that thins, or etches, the outer material layer to a desired thickness. The outer layer thinning, or etching, instrument includes some type of tool that is directed onto the surface of the wafer. This tool must be properly positioned along the surface of the wafer to ensure that the thinning, or etching, process is performed at the correct location on the wafer surface. To ensure that the wafer is properly processed, an accurate correlation between the outer material layer thickness map and the position of the wafer with respect to the thinning, or etching, tool is required. This correlation between the outer material layer thickness map and the position of the wafer with respect to the thinning, or etching tool is accomplished by registering, or co-registering, the wafer to both the wafer metrology instrument and the thinning, or etching instrument in a consistent and repeatable manner.

The current approach for consistently co-registering a semiconductor wafer to both metrology and thinning, or etching instruments begins by marking, or scribing, the wafer with a set of alignment fiducials during the metrology process. The wafer is then placed in the etching instrument on a larger diameter wafer which serves as a surround. The surround is made of the same material as the wafer undergoing work to maintain a consistent reaction in the thinning, or etching, process along the edge of the wafer. The flat of the fiducialized wafer is then abutted to a flat of a registration surface, also made of the same material as the wafer for the same reason as the surround, that is taped to the surface of the surround, thereby registering the wafer in one direction. The wafer metrology fiducials are then visually aligned with a corresponding set of scribe marks on an aluminum holding plate, or platen, in the thinning, or etching instrument. Once aligned, two additional registration surfaces, also made of the same material as the wafer for the same reason as the surround, and the first registration surface, are abutted against the wafer and taped to the surround to maintain the position of the wafer. The surround is then taped to the platen and the thinning, or etching, process may begin.

As can be readily determined, the above-described co-registration procedure is time consuming and prone to human error. Furthermore, the above-described co-registration procedure includes scribing the water which produces particulate contamination that can adversely affect the thinning, or etching, process. Also, the use of scribe marks requires viewing into the thinning, or etching, instrument to perform the visual alignment. However, many instruments cannot be opened regularly and quickly to perform such a visual alignment, and many do not allow interior cameras to be used due to corrosive processes.

Accordingly, it would be desirable to provide a method for co-registering a semiconductor wafer undergoing work in one or more blind processing instruments without the need for scribing the wafer or visually aligning the wafer in an instrument.

SUMMARY OF THE INVENTION

The present invention contemplates a method for co-registering a semiconductor wafer undergoing work in one or more blind process modules. This method relies on the ability to register a semiconductor wafer to a single process module in a consistent and highly repeatable, for example, on the order of tens of micrometers, manner. An apparatus for performing such a singular registration procedure on a semiconductor wafer having a flat is described in a related patent application entitled, Apparatus for Providing Consistent, Non-Jamming Registration of Semiconductor Wafers, U.S. patent application Ser. No. 07/937,793, filed on Aug. 28, 1993. Such an apparatus can be realized in three embodiments, each of which provides a non-jamming feature.

The first two embodiments consist of a metal plate upon which a wafer undergoing work lays flat. The wafer is registered to the metal plate by three rollers that are fixedly mounted to the plate. Two of these three fixedly mounted rollers are positioned on the metal plate such that the flat of the wafer, when properly registered, is abutted against both of these rollers. The third fixedly mounted roller is positioned on the metal plate such that the wafer, when properly registered, is abutted against this roller at a point on the wafer approximately −120° from the wafer flat. Proper registration is ensured by a fourth, adjustable roller that is fixedly mounted to a moveable metal bracket which allows the roller to move in an approximately radial direction with respect to the wafer. This fourth, adjustable roller applies a force against the wafer, by way of a force applied to the moveable metal bracket at a point on the wafer approximately 120° from the wafer flat. This force, coupled with the rolling capability of the rollers, ensures that an improperly registered wafer will be rotated into the proper registration position. Also, due to the fact that the rollers, by virtue of having rolling element bearings, generally exhibit only a slight amount of friction, or a rolling friction, the effective coefficient of friction between the rollers and the wafer is significantly less than a critical value in the effective coefficient of friction above which wafer jamming occurs. Thus, the wafer will be properly registered without jamming.

The only difference between the first and the second embodiments is the way in which the metal bracket is movable. In the first embodiment, the metal bracket slides along an approximately radial groove, with respect to the wafer, formed in the metal plate. In the second embodiment, the metal bracket pivots in a manner that allows the roller to move in the approximately radial direction with respect to the wafer.

The third embodiment encompasses essentially the same principle of the first two embodiments except that metal flexures are substituted for rollers. These metal flexures are created by fabricating or milling a metal plate to include such flexures. Associated with each metal flexure are one or more registration surfaces. These registration surfaces, either separately fixedly mounted to each flexure or fabricated or milled along with the flexures, serve to properly register the wafer. Similar to the rollers of the first two embodiments, two registration surfaces, both associated with one flexure, are used to register the wafer flat. Also, one registration surface registers a point on the wafer approximately −120° from the wafer flat and one registration surface applies a force against the wafer at a point on the wafer approximately 120° from the wafer flat. The applied force, coupled with the flexing capability of the flexures, ensures that an improperly registered wafer will be rotated, along with the point contacted registration surfaces, into the proper registration position. Also, since forces tending to impede such rotation are determined by movement of the flexures and not by friction against the registration surfaces, wafer jamming does not occur. Thus, as long as the motion of the flexures is limited to acceptable values, the wafer will be properly registered without jamming.

An apparatus for performing such a singular registration procedure on a semiconductor wafer having a notch is described in a related patent application entitled, Apparatus and Method for Providing Consistent, Non-Jamming Registration of Notched Semiconductor Wafers. Such an apparatus is comprised of a metal mounting plate upon which a notched wafer undergoing work lays flat. The wafer is partially registered to the metal plate by two rollers that are fixedly mounted to the plate. The first of these fixedly mounted rollers is positioned on the metal plate such that, when the wafer is properly registered, both walls of the wafer notch are abutted against this roller. The second of these fixedly mounted rollers is positioned on the metal plate such that the wafer, when properly registered, is abutted against this roller at a point on the wafer approximately— 120° from the wafer notch. Proper registration is ensured by a third, adjustable roller that is fixedly mounted on a moveable metal bracket which allows the roller to move in an approximately radial direction with respect to the wafer. This third, adjustable roller applies a force against the wafer, at a point on the wafer approximately 120° from the wafer notch, by way of an external force applied to the moveable metal bracket. This force, coupled with the rolling capability of the rollers, ensures that an improperly registered wafer will be rotated into the proper registration position. Also, due to the fact that the rollers, by virtue of having rolling element bearings, generally exhibit only a slight amount of friction, or a rolling friction, the effective coefficient of friction between the rollers and the wafer is significantly less than a critical value in the effective coefficient of friction above which wafer jamming occurs. Thus, the wafer will be properly registered without jamming.

It should be noted that unlike the prior art, where the registration surfaces and the surround are fabricated from the same material as the wafer undergoing work, the rollers, registration surfaces, and associated mounting plates, described above are not subject to this same material constraint. As previously described, this constraint is required in the prior art so that a consistent thinning, or etching process is maintained along the wafer edge. Although this material constraint does fulfill the objective of maintaining a consistent process, an undesirable result of increased material replacement occurs since the thinning, or etching process depreciatively affects the registration and surround materials.

The material constraint and resulting material replacement problems of the prior art are overcome in the above-described singular registration apparatus by shielding the rollers, registration surfaces, and associated mounting plates from the depreciative affects of the thinning, or etching process. Thus, the materials used in the above-described singular registration apparatuses may be selected with practical considerations such as cost and reliability in mind, instead of impractical and costly material constraints.

The singular registration apparatus described above can be used in metrology and thinning, or etching processes, among others, and they provide consistent, non-jamming, singular registration of semiconductor wafers undergoing process work regardless of diameter variations among processed wafers. Furthermore, the use of these singular registration apparatus can decrease the registration time associated with the tedious visual alignment procedure of the prior art, while minimizing the potential for human error.

In addition to the above-described singular registration apparatuses, the present invention method also relies on the ability of one of the process modules to measure, or detect, surface or layer thickness characteristics in a semiconductor wafer and surface patterns imprinted, or etched, into a semiconductor wafer by the other process modules. Thus, a wafer metrology instrument, which is able to measure, or detect, surface patterns and layer thicknesses in a semiconductor wafer, is typically utilized for the present invention method. In the case where a surface pattern is etched into a semiconductor wafer, a wafer etching instrument is typically used.

The present invention method is realized by incorporating one of the above-described singular registration apparatus in each of the process modules to be co-registered, including the wafer metrology instrument and, when applicable, the wafer etching instrument. Given the consistent wafer positioning provided by the singular registration apparatuses, the location of the coordinate axes of each process module must be determined with respect to the position of the wafer that is registered therein. The present invention method provides three approaches for determining the location of these axes: (1) an absolute location of the axes, (2) a relative location of the axes using the wafer metrology instrument to measure, or detect, the position of a pattern etched into a semiconductor wafer using the wafer etching instrument, and (3) a relative location of the axes using the wafer metrology instrument to measure, or detect, surface or layer thickness characteristics in a semiconductor wafer as modified by wafer processing. The absolute approach requires an adherence to stringent mechanical alignment tolerances, whereas the relative approaches require some computational capability in order to transform the axes between each corresponding process module. If the degree of co-registration is less severe, for example, on the order of hundreds of micrometers, the relative method of co-registration described herein can be applied to similar metrology and etch modules in conjunction with a repeatable transport of wafers by means of one or more robotic arms without the need for the singular registration apparatus. The robotic arm places a calibration wafer in the etch module to be patterned and then in the metrology module to be measured. The thus-determined co-ordinate transform is then applied to the metrology wafer for all other wafers to be processed. The sufficiently repeatable robotic arms move the wafers from the metrology module to the etching module for processing, etc. Passage through the necessary vacuum load lock and any other intermediate position must not disturb the wafer placement repeatability. Regardless of which approach is followed, the determination of the location of the coordinate axes in each process module is an effective co-registration of a semiconductor wafer.

From the above descriptive summary it is apparent how the present invention provides a method for co-registering a wafer undergoing work in one or more blind process modules without the need for scribing the wafer or visually aligning the wafer in the process modules.

Accordingly, the primary objective of the present invention is to provide a method for co-registering a wafer undergoing work in one or more blind process modules without the need for scribing the wafer or visually aligning the wafer in the process modules.

Other objectives and advantages of the present invention will become apparent to those skilled in the art from reading the following detailed description read in conjunction with the appended claims, and the drawings attached hereto.

BRIEF DESCRIPTION OF THE DRAWINGS

In order to facilitate a fuller understanding of the present invention, reference is now made to the drawings. These drawings should not be construed as limiting the present invention, but are intended to be exemplary only.

FIG. 1 is a drawing of one method, according to the present invention, for showing the absolute approach for determining the location of the coordinate axes in a wafer metrology process module and a wafer etching process module, and thereby for co-registering a semiconductor wafer;

FIG. 2 is a drawing of another method, according to the present invention, for showing the relative approaches for determining the location of the coordinate axes in a non-aligned wafer metrology process module and a non-aligned wafer etching process module, and thereby for co-registering a semiconductor wafer;

FIG. 3 is a drawing of a further method, according to the present invention, for showing the relative approaches for determining the location of the coordinate axes in an aligned wafer metrology process module and a non-aligned wafer etching process module, and thereby for co-registering a semiconductor wafer; and FIG. 4 is a drawing of a method, according to the present invention, for showing the relative approaches for determining the location of the coordinate axes in a non-aligned wafer metrology process module and an aligned wafer etching process module, and thereby for co-registering a semiconductor wafer.

DETAILED DESCRIPTION OF THE INVENTION

Referring to FIG. 1, there is shown a drawing of a method, according to the present invention, for showing an absolute approach for determining the location of the coordinate axes in a wafer metrology process module 10 and a wafer etching process module 12, and thereby for co-registering a semiconductor wafer 14. For the sake of clarity, only two specific process modules are described herein. It will nevertheless be understood that three or more such process modules can be included. Further, such additional process modules can be adapted to perform either the same function as the wafer etching process module 12 or the wafer metrology process module 10. Alternatively, such additional process modules can be adapted to perform other function as well. The wafer metrology process module 10 uses a roller-based singular registration apparatus 16 to register the semiconductor wafer 14 on a metrology stage 18. This singular registration is such that the XY coordinate axes of the wafer metrology process module 10 are aligned with the XY coordinate axes of the metrology stage 18. Similarly, the wafer etching process module 12 uses a roller-based singular registration apparatus 20 to register the semiconductor wafer 14 on an etching stage 22. This singular registration is such that the XY coordinate axes of the wafer etching process module 12 are aligned with the XY coordinate axes of the etching stage 22. Accordingly, since the semiconductor wafer 14 is singularly registered such that the XY coordinates of each process module 10, 12 are aligned with the XY coordinates of each stage 18, 22, the semiconductor wafer 14 is co-registered to the wafer metrology process module 10 and the wafer etching process module 12.

The alignments in this absolute approach may be performed in several different ways such as by eye, laser gauge, or by trial and error etch pattern alignments. Understandably, this approach requires an adherence to stringent mechanical alignment tolerances which must be maintained in each process module 10, 12. These alignment tolerances are typically on the order of tens of micrometers, which are difficult to maintain considering the deterioration and drift that occurs in the registration components 16, 20 with usage and over time.

Referring to FIG. 2, there is shown a drawing, according to the present invention, for showing a pattern etched relative approach for determining the location of the coordinate axes in the wafer metrology process module 10 and the wafer etching process module 12, and thereby for co-registering the semiconductor wafer 14. The wafer metrology process module 10 again uses the roller-based singular registration apparatus 16 to register the semiconductor wafer 14 on the metrology stage 18. However, this singular registration is such that the XY coordinate axes of the wafer metrology process module 10 are not aligned with the XY coordinate axes of the metrology stage 18. Similarly, the wafer etching process module 12 again uses the roller-based singular registration apparatus 20 to register the semiconductor wafer 14 on the etching stage 22. However, this singular registration is such that the XY coordinate axes of the wafer etching process module 12 are not aligned with the XY coordinate axes of the etching stage 22.

To determine the relative location of the XY coordinate axes in the wafer metrology 18 and the wafer etching process stage 22, and thereby to co-register the semiconductor wafer 14, a pattern is etched into the semiconductor wafer 14 by the wafer etching process module 12. This pattern may be in the form of the XY coordinate axes of the wafer etching process module 12, or any coordinate pattern that may be measured, or detected, by the wafer metrology process module 10. Accordingly, the semiconductor wafer 14 is transferred to the wafer metrology process module 10 after it has been pattern etched so that the coordinate pattern may be measured, or detected.

Once the coordinate pattern is measured, or detected, by the wafer metrology process module 10, a coordinate transformation is calculated so as to determine the relative location of the XY coordinate axes of the wafer etching process stage 22 with respect to the XY coordinate axes of the wafer metrology process module 10, and vice versa, thereby co-registering the semiconductor wafer 14. This calculation is typically performed by a master controller that controls and monitors the operation of both the wafer metrology process module 10 and the wafer etching process module 12, although a controller dedicated to the wafer metrology process module 10 may also perform this calculation. The calculation itself is merely a transformation of the coordinate system of the wafer etching process module 12 into the coordinate system of the wafer metrology process module 10, which may be performed in the cartesian, rectangular, or polar coordinate systems.

At this point it should be noted that although the XY coordinate axes of the wafer metrology process module 10 and the wafer etching process module 12 are shown to be non-aligned with the XY coordinate axes of the metrology stage 18 and the etching stage 22, respectively, the alignment relationship between the wafer metrology process module 10 and the metrology stage 18 acts as a reference from which the coordinate transformation is calculated. Accordingly, the above-described pattern etched relative approach may be followed if the XY coordinate axes of the wafer metrology process module 10 and the metrology stage 18 and the etching stage 22 are not aligned and the XY coordinate axes of the wafer etching process module 12 and the etching stage 22 are not aligned as shown in FIG. 2, or if the XY coordinate axes of the wafer metrology process module 10 and the metrology stage 18 and the etching stage 22 are aligned while the XY coordinate axes of the wafer etching process module 12 and the etching stage 22 are not aligned as shown in FIG. 3, or if the XY coordinate axes of the wafer metrology process module 10 and the metrology stage 18 and the etching stage 22 are not aligned while the XY coordinate axes of the wafer etching process module 12 and the etching stage 22 are aligned as shown in FIG. 4.

Referring again to FIG. 2, there is shown a drawing, for showing a surface or layer thickness characteristics relative approach for determining the location of the coordinate axes in the wafer metrology process stage 18 and the wafer etching process stage 22, and thereby for co-registering the semiconductor wafer 14. To determine the relative location of the XY coordinate axes in the wafer metrology process module 10 and the wafer etching process module 12, and thereby to co-register the semiconductor wafer 14, the semiconductor wafer 14 is first measured in the wafer metrology process module 10 to generate an initial outer material layer thickness map. The semiconductor wafer 14 is then transferred to the wafer etching process module 12 where it is etched according to the outer material layer thickness map, just as in production. The semiconductor wafer 14 is then transferred back to the wafer metrology process module 10 where it is remeasured and a final outer material layer thickness map is generated. Any misregistration of the semiconductor wafer 14 due to errors in co-registration will be directly observable from the wafer 14 since the wafer etching process module 12 etched the wafer 14 according to the wafer metrology process module generated outer material layer thickness map.

A master controller, or a controller dedicated to the wafer metrology process module 10, compares a predicted and the final outer material layer thickness map and calculates a coordinate transformation to determine the relative location of the XY coordinate axes of the wafer etching process module 12 with respect to the XY coordinate axes of the wafer metrology process module 10, and vice versa, thereby co-registering the semiconductor wafer 14. Similar to the pattern etched relative approach, the calculation may be performed in the cartesian, rectangular, or polar coordinate systems.

At this point it should be noted that, similar to the pattern etched relative approach, the alignment relationship between the wafer metrology process module 10 and the metrology stage 18 acts as a reference from which the coordinate transformation is calculated. Accordingly, the above-described surface or layer thickness characteristics relative approach may be followed in the alignment situations shown in FIGS. 2, 3, and 4.

It should also be noted with respect to both relative approaches that, although the XY coordinate axes of the wafer metrology process module 10 need not be aligned with the XY coordinate axes of the metrology stage 18 and the XY coordinate axes of the wafer etching process module 12 need not be aligned with the XY coordinate axes of the etching stage 22, the field of search for detecting etch patterns or comparing thickness maps is considerably reduced when the XY coordinate axes of the wafer metrology process module 10 are relatively close to the XY coordinate axes of the metrology stage 18 and the XY coordinate axes of the wafer etching process module 12 are relatively close to the XY coordinate axes of the etching stage 22, respectively. This results in a reduction in the corresponding computational times.

Finally, it should be noted that the wafer transfer in all three approaches may be performed either manually or automatically, such as with a robot arm in a cluster tool.

With all three approaches of the present invention semiconductor wafer co-registration method now fully described it can thus be seen that the primary objective set forth above is efficiently attained and, since certain changes may be made in the above described approaches without departing from the scope of the invention, it is intended that all matter contained in the above description or shown in the accompanying drawings shall be interpreted as illustrative and not in a limiting sense.

What is claimed is:

1. A method for co-registering a semiconductor wafer undergoing work in one or more blind process modules, said method comprising the steps of:

registering a semiconductor wafer to a first stage in a first blind process module in a consistent but arbitrary manner with respect to the coordinate axes of said first stage and the coordinate axes of said first blind process module;

patterning said registered semiconductor wafer in said first blind process module;

registering said patterned semiconductor wafer to a second stage in a second blind process module in a consistent but arbitrary manner with respect to the coordinate axes of said second stage and the coordinate axes of said second blind process module;

detecting the location of said pattern in said registered patterned semiconductor wafer in said second blind process module; and calculating a coordinate transform between coordinate axes of said first blind process module and said second blind process module based on the location of said detected pattern to determine the relative location of the coordinate axes of said first blind process module with respect to the coordinate axes of said second blind process module, and vice versa, thereby co-registering said semiconductor wafer to both said first blind process module and said second blind process module.

2. The method as defined in claim 1, wherein said step of patterning said registered semiconductor wafer in said first blind process module includes the step of etching a pattern in said registered semiconductor wafer.

3. The method as defined in claim 1, wherein said step of patterning said registered semiconductor wafer in said first blind process module includes the step of imprinting a pattern in said registered semiconductor wafer.

4. The method as defined in claim 1, wherein said step of detecting the location of said pattern in said registered patterned semiconductor wafer in said second blind process module includes the step of measuring said pattern in said registered patterned semiconductor wafer.

5. A method for co-registering a wafer to one or more process modules, said method comprising the steps of:

registering a wafer to a first stage in a first process module in a consistent but arbitrary manner with respect to the coordinate axes of said first stage and the coordinate axes of said first process module;

patterning said registered wafer in said first process module;

registering said patterned wafer to a second stage in a second process module in a consistent but arbitrary manner with respect to the coordinate axes of said second stage and the coordinate axes of said second process module;

detecting the location of said pattern in said registered patterned wafer in said second process module; and calculating a coordinate transform between coordinate axes of said first process module and said second process module based on the location of said detected pattern to determine the relative location of the coordinate axes of said first process module with respect to the coordinate axes of said second process module, and vice versa, thereby co-registering said wafer to both said first process module and said second process module.

6. The method as defined in claim 5, wherein said step of patterning said registered wafer in said first process module includes the step of etching a pattern in said registered wafer.

7. The method as defined in claim 5, wherein said step of patterning said registered wafer in said first process module includes the step of imprinting a pattern in said registered wafer.

8. The method as defined in claim 5, wherein said step of detecting the location of said pattern in said registered patterned wafer in said second process module includes the step of measuring said pattern in said registered patterned wafer.

9. A method for co-registering a semiconductor wafer undergoing work in one or more blind process modules, said method comprising the steps of:

registering a semiconductor wafer to a first stage in a first blind process module in a consistent but arbitrary manner with respect to the coordinate axes of said first stage and the coordinate axes of said first blind process module;

detecting the location of surface or layer thickness characteristics in said registered semiconductor wafer in said first blind process module;

registering said semiconductor wafer to a second stage in a second blind process module in a consistent but arbitrary manner with respect to the coordinate axes of said second stage and the coordinate axes of said second blind process module;

processing said registered semiconductor wafer in said second blind process module based on the location of said detected surface or layer thickness characteristics in said registered semiconductor wafer in said first blind process module;

registering said processed semiconductor wafer to said first stage in said first blind process module in said consistent but arbitrary manner;

detecting the location of said surface or layer thickness characteristics in said registered processed semiconductor wafer in said first blind process module;

predicting the location of surface or layer thickness characteristics in said registered semiconductor wafer in said first blind process module after processing said registered semiconductor wafer in said second blind process module based on the location of said detected surface or layer thickness characteristics in said registered semiconductor wafer in said first blind process module;

comparing the location of said detected surface or layer thickness characteristics in said registered processed semiconductor wafer in said first blind process module to the prediction location of said surface or layer thickness characteristics in said registered semiconductor wafer in said first blind process module;

calculating a coordinate transform between coordinate axes of said first blind process module and said second blind process module based on said comparison to determine the relative location of the coordinate axes of said first blind process module with respect to the coordinate axes of said second blind process module, and vice versa, thereby co-registering said semiconductor wafer to both said first blind process module and said second blind process module.

10. The method as defined in claim 9, wherein said step of processing said registered semiconductor wafer in said second blind process module includes the step of etching said registered semiconductor wafer in said second blind process module based on the location of said detected surface or layer thickness characteristics in said registered semiconductor wafer in said first blind process module.

11. The method as defined in claim 9, wherein said step of detecting the location of surface or layer thickness characteristics in said registered semiconductor wafer in said first blind process module includes the step of measuring the location of surface or layer thickness characteristics in said registered semiconductor wafer in said first blind process module.

12. The method as defined in claim 9, wherein said step of detecting the location of surface or layer thickness characteristics in said registered processed semiconductor wafer in said first blind process module includes the step of measuring the location of surface or layer thickness characteristics in said registered processed semiconductor wafer in said first blind process module.

13. A method for co-registering a wafer to one or more process modules, said method comprising the steps of:

registering a wafer to a first stage in a first process module in a consistent but arbitrary manner with respect to the coordinate axes of said first stage and the coordinate axes of said first process module;

detecting the location of surface or layer thickness characteristics in said registered wafer in said first process module;

registering said wafer to a second stage in a second process module in a consistent but arbitrary manner with respect to the coordinate axes of said second stage and the coordinate axes of said second process module;

processing said registered wafer in said second process module based on the location of said detected surface or layer characteristics in said registered wafer in said first process module;

registering said processed wafer to said first stage in said first process module in said consistent but arbitrary manner;

detecting the said location of surface or layer thickness characteristics in said registered processed wafer in said first process module;

predicting the location said of surface or layer thickness characteristics in said registered wafer in said first process module after processing said registered wafer in said second process module based on the location of said detected surface or layer thickness characteristics in said registered wafer in said first process module;

comparing the location of said detected surface or layer thickness characteristics in said registered processed wafer in said first process module to the location of said predicted surface or layer thickness characteristics in said registered wafer in said first process module;

calculating a coordinate transform between coordinate axes of said first process module and said second process module based on said comparison so as to determine the relative location of the coordinate axes of said first process module with respect to the coordinate axes of said second process module, and vice versa, thereby co-registering said wafer to both said first process module and said second process module.

14. The method as defined in claim 13, wherein said step of processing said registered wafer in said second process module includes the step of etching said registered wafer in said second process module based on the location of said detected surface or layer thickness characteristics in said registered wafer in said first process module.

15. The method as defined in claim 13, wherein said step of detecting the location of surface or layer thickness characteristics in said registered wafer in said first process module includes the step of measuring the location of surface or layer thickness characteristics in said registered wafer in said first process module.

16. The method as defined in claim 13, wherein said step of detecting the location of surface or layer thickness characteristics in said registered processed wafer in said first process module includes the step of measuring the location of surface or layer thickness characteristics in said registered processed wafer in said first process module.

17. The method as claimed in claim 13 wherein the said registering of said wafer in said first and second process modules is accomplished by using a robotic arm.

18. A method for co-registering a wafer to one or more process modules, said method comprising the steps of:

measuring said wafer in a first process module to generate a first thickness map;

etching said wafer in a second process module according to said first thickness map;

remeasuring said wafer in said first process module to generate a final thickness map; and calculating a coordinate transform between coordinate axes of said first process module and said second process module based on a comparison of said first and final thickness maps, thereby co-registering said wafer to both said first process module and said second process module.

* * * * *

UNITED STATES PATENT AND TRADEMARK OFFICE
CERTIFICATE OF CORRECTION

PATENT NO.    :   5,610,102
DATED         :   March 11, 1997
INVENTOR(S)   :   Gardopee et al It is certified that error appears in the above-identified patent and that said Letters Patent is hereby corrected as shown below:

Column 10, line 66 (claim 13, line 24) "location said"
should be --said location--

Signed and Sealed this

Eleventh Day of November, 1997

*Attest:*

BRUCE LEHMAN

*Attesting Officer*          Commissioner of Patents and Trademarks